(12) United States Patent
Morimoto et al.

(10) Patent No.: US 6,566,916 B1
(45) Date of Patent: May 20, 2003

(54) CHOPPER TYPE COMPARATOR

(75) Inventors: Haruaki Morimoto, Osaka (JP); Yukio Sato, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/197,432

(22) Filed: Jul. 18, 2002

(30) Foreign Application Priority Data

Nov. 20, 2001 (JP) ......................................... 2001-354941

(51) Int. Cl.[7] .......................... H03K 5/153; H03K 5/22
(52) U.S. Cl. ........................................ 327/77; 327/93
(58) Field of Search ............................. 327/77, 79, 63, 327/80, 91, 93, 124

(56) References Cited

U.S. PATENT DOCUMENTS 4,745,393 A  *  5/1988  Tsukada et al. ............. 341/136
5,952,951 A  *  9/1999  Fujino ......................... 341/159
6,271,691 B1 *  8/2001  Toyoda et al. ................ 327/77

* cited by examiner

Primary Examiner—Tuan T. Lam
(74) Attorney, Agent, or Firm—Volentine Francos, PLLC

(57) ABSTRACT

A chopper type comparator includes an input switch circuit which inputs an input voltage and a reference voltage alternately in response to a control signal; and an output terminal which supplies an output voltage, having a level defined based on the difference between the input voltage and the reference voltage. The comparator further a MOS transistor operating in response to a control signal, and a timing control circuit which provide a delay to the control signal to be supplied to the first MOS transistor and the input switch circuit.

10 Claims, 4 Drawing Sheets

CHOPPER TYPE COMPARATOR

CROSS REFERENCE TO RELATED APPLICATION

This application claims the priority of Application No. 2001-354941, filed Nov. 20, 2001 in Japan, the subject matter of which is incorporated herein by reference.

TECHNICAL FIELD OF THE INVENTION

This invention relates to a chopper type comparator.

BACKGROUND OF THE INVENTION

In a chopper type comparator, an input voltage and a predetermined reference voltage is compared and an output voltage corresponding to the reference between the input voltage and the reference voltage is generated. Recently, it is required to reduce an offset difference of an output voltage.

OBJECTS OF THE INVENTION

Accordingly, an object of the present invention is to provide a chopper type comparator in which an offset difference is reduced.

Additional objects, advantages and novel features of the present invention will be set forth in part in the description that follows, and in part will become apparent to those skilled in the art upon examination of the following or may be learned by practice of the invention. The objects and advantages of the invention may be

SUMMARY OF THE INVENTION

According to a first aspect of the present invention, a chopper type comparator includes an input switch circuit which inputs an input voltage and a reference voltage alternately in response to a control signal; an output terminal which supplies an output voltage, having a level defined based on the difference between the input voltage and the reference voltage; a capacitor which is coupled between the input switch circuit and the output terminal; and a node which is coupled between the capacitor and the output terminal; a first inverter coupled between the node and the output terminal.

The comparator further includes a first MOS transistor which is coupled between the node and the output terminal in parallel to the first inverter and operates in response to the control signal, the first MOS transistor having a substrate voltage terminal; a supply terminal which provides a supply voltage; a bias control circuit which selectively connects the substrate voltage terminal of the first MOS transistor to the supply terminal and the output terminal in response to the control signal; and a timing control circuit which provide a delay to the control signal to be supplied to the first MOS transistor and the input switch circuit.

According to a second aspect of the present invention, a chopper type comparator includes an input switch circuit which inputs an input voltage and a reference voltage alternately in response to a control signal; an output terminal which supplies an output voltage, having a level defined based on the difference between the input voltage and the reference voltage; a capacitor which is coupled between the input switch circuit and the output terminal; a node which is coupled between the capacitor and the output terminal; a first inverter coupled between the node and the output terminal; a first MOS transistor which is coupled between the node and the output terminal in parallel to the first inverter and operates in response to the control signal, the first MOS transistor having a substrate voltage terminal; a second MOS transistor which is coupled between the node and the output terminal in parallel to the first inverter and operates in response to the control signal, the second MOS transistor having a substrate voltage terminal; and a supply terminal which provides a supply voltage.

The comparator further includes a first bias control circuit which selectively connects the substrate voltage terminal of the first MOS transistor to the supply terminal and the output terminal in response to the control signal; a second bias control circuit which selectively connects the substrate voltage terminal of the second MOS transistor to the supply terminal and the output terminal in response to the control signal; and a timing control circuit which provide a delay to the control signal to be supplied to the first MOS transistor, the first bias control circuit and the input switch circuit.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is; therefore, not to be taken in a limiting sense, and scope of the present inventions is defined only by the appended claims.

Figure 1:
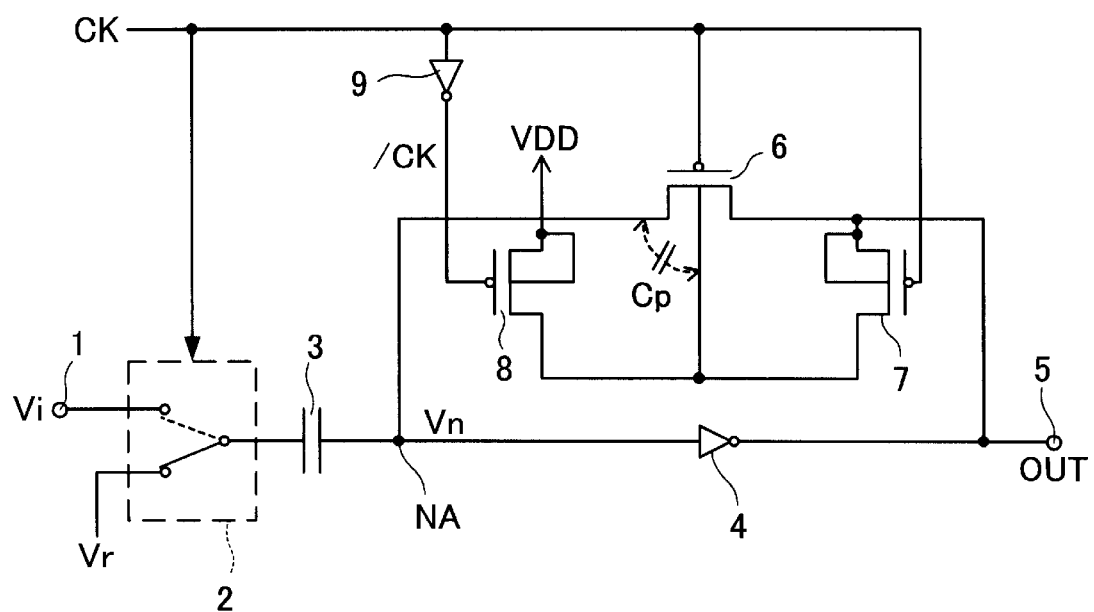
FIG. 1 is a circuit diagram showing a chopper type comparator.

FIG. 1 shows a chopper type comparator, which includes an input terminal 1 and an input switch circuit 2. An input voltage Vi is applied to the input terminal 1. The input terminal 1 is connected to an input of the input switch circuit 2. The input switch circuit 2 includes another input terminal to which a reference voltage Vr is applied. The input switch circuit 2 is supplied with a clock signal CK, which functions as a switching control signal. The input switch circuit 2 has an output terminal connected to a terminal of a capacitor 3. The other terminal of the capacitor 3 is connected to an internal node NA. The node NA is connected to an input terminal of an inverter 4. An output of the inverter 4 is connected to an output terminal 5.

The chopper type comparator also includes a P channel MOS transistor (PMOS) 6, which is connected between the node NA and the output terminal 5. The PMOS transistor 6 is turned on and off in response to the clock signal CK. The comparator further includes another two PMOS transistors 7 and 8, and another inverter 9. The PMOS transistor 7 is connected between a drain of the PMOS transistor 6 and a substrate of the PMOS transistor 6. The PMOS transistor 8 is connected between a supply terminal VDD and the substrate of the PMOS transistor 6. The clock signal CK is supplied to a gate of the PMOS transistor 7. An input terminal of the inverter 9 is supplied with the clock signal CK, while an output terminal of the inverter 9 is connected to a gate of the PMOS transistor 8. In other words, a reversed clock signal /CK is supplied to the gate of the PMOS transistor 8.

In the above-described chopper type comparator, when the clock signal CK is at a lower level "L", the input switch circuit 2 allows the input terminal 1 to be in connection. When the clock signal CK is at "L", the PMOS transistors 6 and 7 are turned off, and the PMOS transistor 8 is turned on. As a result, a short circuit is generated between the input and output terminals of the inverter 4 via the PMOS transistor 6. Since the PMOS transistor 7 is turned on at the same time as the PMOS transistor 6 is turned on, the PMOS transistor 7 makes a substrate voltage of the PMOS 6 to a threshold voltage Vt, and prevents the threshold voltage Vt from increasing due to a substrate bias effect. A voltage at the node NA is converged to the threshold voltage Vt promptly. When a voltage at the node NA becomes Vt, the capacitor 3 charges at a voltage of "Vi-Vt".

After that, the clock signal CK is turned to a higher level "H", the input switch circuit 2 allows the reference voltage Vr to be inputted. At the same time, the PMOS transistors 6 and 7 are turned off, and the PMOS transistor 8 is turned on. As a result, the input and output terminals of the inverter 4 are disconnected, so that the inverter 4 inverts and amplifies a voltage at the node NA. At this time, the PMOS transistor 8 is turned on, and the substrate voltage of the PMOS transistor 6 becomes the supply voltage VDD. The PMOS transistor 6 is turned off promptly. One side of the capacitor 3 is applied with the reference voltage Vr via the input switch circuit 2, so that a voltage Vn at the node NA becomes "Vr-(Vi-Vt)".

When the voltage Vn at the node NA is higher than the threshold voltage Vt of the inverter 4, that is, when the reference voltage Vr is larger than the input voltage Vi, a low level output signal OUT is outputted from the output terminal 5. On the other hand, when the voltage Vn at the node NA is lower than the threshold voltage Vt of the inverter 4, that is, when the reference voltage Vr is lower than the input voltage Vi, a high level output signal OUT is outputted from the output terminal 5.

According to the chopper type comparator, shown in FIG. 1, a parasitic capacitance Cp is generated between a source and substrate of the PMOS transistor 6. When the clock signal CK is turned from "L" to "H" and the PMOS transistor 6 is turned off, charge partitioning is generated between the capacitor 3 and the parasitic capacitance Cp. As a result, a voltage at the node NA is shifted from the threshold voltage Vt. Therefore, when the difference between the input voltage Vi and reference voltage Vr is small, an operation error may be occurred due to an offset difference or discrepancy.

Figure 2:
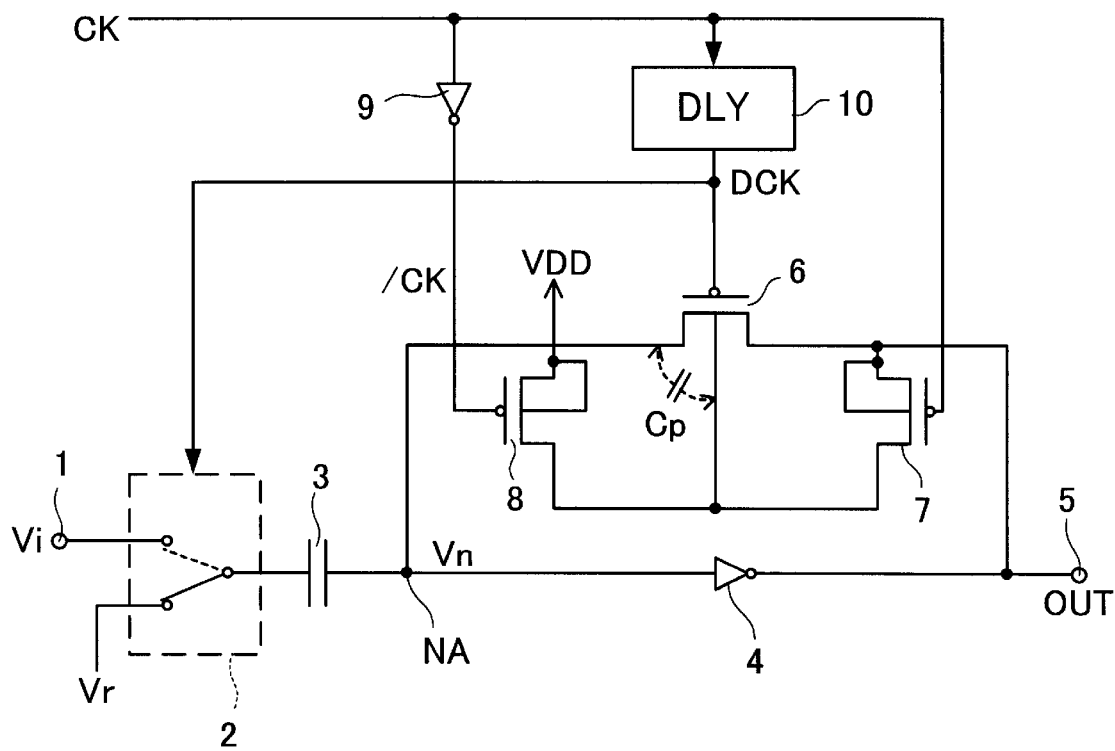
FIG. 2 is a circuit diagram showing a chopper type comparator according to the present invention.

FIG. 2 shows a chopper type comparator according to the present invention. In FIG. 2, the same or corresponding elements to those shown in FIG. 1 are represented by the same reference numerals, and the same description is not repeated.

The chopper type comparator includes an input switch circuit 2 which inputs an input voltage signal Vi and a reference voltage Vr alternately in response to a clock signal CK; an output terminal 5 which supplies an output voltage OUT, having a level defined based on the difference between the input voltage Vi and the reference voltage Vr; a capacitor 3 which is coupled between the input switch circuit 2 and the output terminal 5; a node NA which is coupled between the capacitor 3 and the output terminal 5; a first inverter 4 coupled between the node NA and the output terminal 5; a first PMOS transistor 6 which is coupled between the node NA and the output terminal 5 in parallel to the first inverter 4 and operates in response to the clock signal CK, the first PMOS transistor 6 having a substrate voltage terminal; a supply terminal VDD which provides a supply voltage; a bias control circuit (7 and 8) which selectively connects the substrate voltage terminal of the first PMOS transistor 6 to the supply terminal VDD and the output terminal 5 in response to the clock signal CK; and a timing control circuit 10 which provide a delay to the clock signal CK to be supplied to the first PMOS transistor 6 and the input switch circuit 2.

The delay circuit 10 functions to delay the clock signal CK by a period of time "dt" to provide a delayed clock signal DCK, which is supplied to a gate of the PMOS transistor 6 and the input switch circuit 2.

An input voltage Vi is applied to the input terminal 1. The input terminal 1 is connected to an input of the input switch circuit 2. The input switch circuit 2 includes another input terminal to which a reference voltage Vr is applied. The input switch circuit 2 is supplied with the clock signal CK, which functions as a switching control signal. The input switch circuit 2 has an output terminal connected to a terminal of the capacitor 3. The other terminal of the capacitor 3 is connected to the internal node NA. The node NA is connected to an input terminal of the inverter 4. An output of the inverter 4 is connected to the output terminal 5.

The PMOS 6 is turned on and off in response to the clock signal CK. The comparator further includes another two PMOS transistors 7 and 8, and another inverter 9. The PMOS transistor 7 is connected between a drain of the PMOS transistor 6 and the substrate voltage terminal of the PMOS transistor 6. The PMOS transistor 8 is connected between a supply terminal VDD and the substrate voltage terminal of the PMOS transistor 6. The clock signal CK is supplied to a gate of the PMOS transistor 7. An input terminal of the inverter 9 is supplied with the clock signal CK, while an output terminal of the inverter 9 is connected to a gate of the PMOS transistor 8. In other words, a reversed clock signal /CK is supplied to the gate of the PMOS transistor 8. A substrate of the PMOS transistor 7 is connected to a source thereof, and a substrate of the PMOS transistor 8 is connected to a source thereof.

Figure 3:
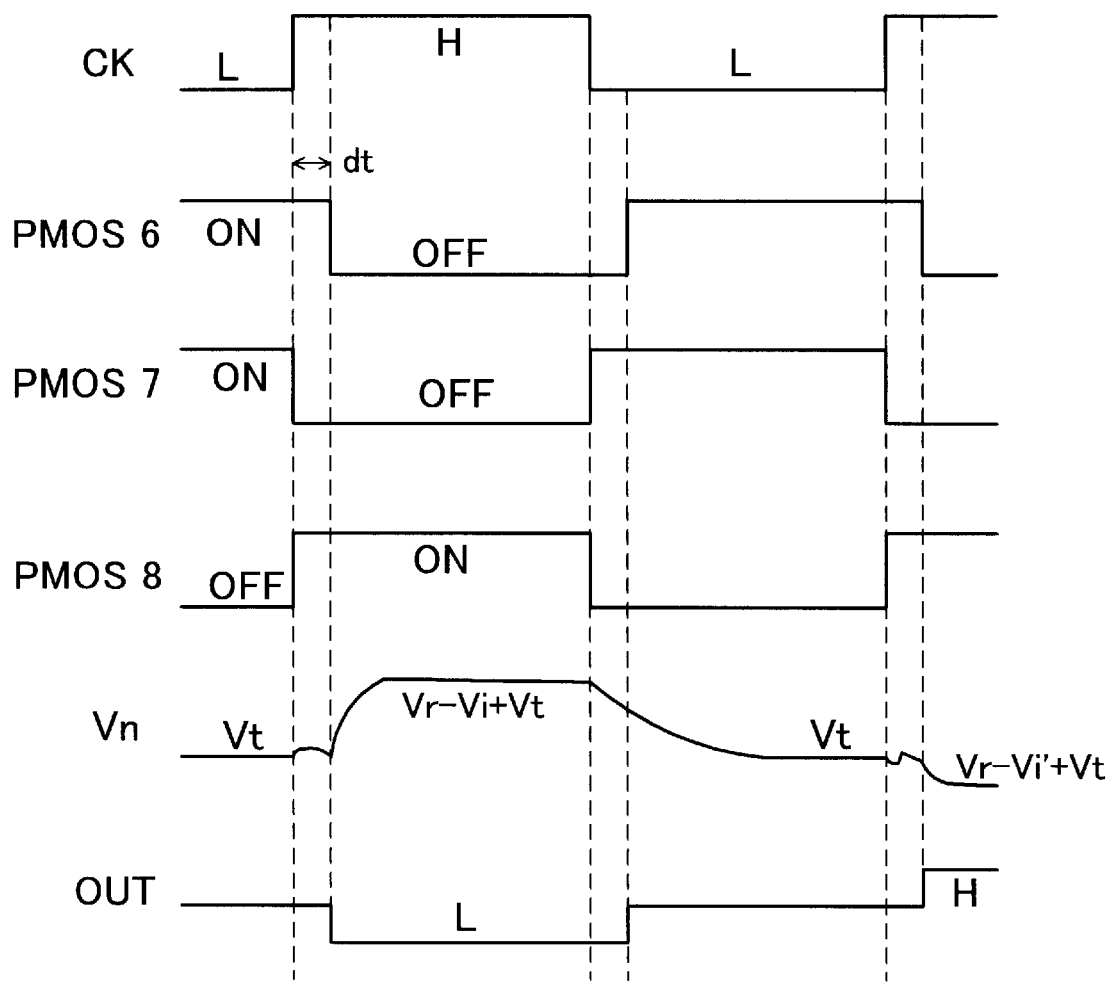
FIG. 3 is a timing chart showing operation of the chopper type comparator, shown in FIG. 2.

As shown in FIG. 3, in the above-described chopper type comparator, when the clock signal CK is at a lower level "L", the input switch circuit 2 allows the input terminal 1 to be in connection. When the clock signal CK is at "L", the PMOS transistors 6 and 7 are turned off, and the PMOS transistor 8 is turned on. As a result, the input and output terminals of the inverter 4 are connected via the PMOS transistor 6. A voltage Vn at the node NA is converged to a threshold voltage Vt of the inverter 4. Therefore, an output signal OUT having a level Vt is outputted. A voltage at the node NA is converged to the threshold voltage Vt promptly. When a voltage at the node NA becomes Vt, the capacitor 3 charges at a voltage of "Vi-Vt".

After that, the clock signal CK is turned to a higher level "H", the PMOS transistor 7 is turned off and the PMOS transistor 8 is turned on. As a result, the substrate voltage of the PMOS transistor 6 is increased to the supply voltage VDD. A voltage Vn at the node NA is changed in accordance with a parasitic capacitance Cp, which is generated between a source and a substrate of the PMOS transistor 6. At this time, since the delayed clock signal DCK supplied to the PMOS transistor is still at a lower level "L", the PMOS transistor 6 maintains to be in a on state. The voltage Vn at the node NA is returned to the threshold voltage Vt of the inverter 4 after a small range of variation. Therefore, a voltage "Vi-Vt" charged at the capacitor 3 is not changed in level.

After a delay time "dt", when the delayed clock signal DCK is turned from "L" to "H", the PMOS transistor 6 is turned off and the input switch circuit 2 allows the reference voltage Vr to be inputted. At the same time, the PMOS transistors 7 and 8 are maintained its current status. Since the reference voltage Vr is supplied to the capacitor 3, a voltage Vn at the node NA becomes "Vr-(Vi-Vt)". When the voltage Vn at the node NA is higher than the threshold voltage Vt of the inverter 4, that is, when the reference voltage Vr is higher than the input voltage Vi, a low level output signal OUT is outputted from the output terminal 5. On the other hand, when the voltage Vn at the node NA is lower than the threshold volt age Vt of the inverter 4, that is, when the reference voltage Vr is lower than the input voltage Vi, a high level output signal OUT is outputted from the output terminal 5.

Subsequently, when the clock signal Ck is turned from "H" to "L", the PMOS transistors 7 and 8 are turned on and off, respectively. After a delay time "dt", the delayed clock signal DCK is turned from "H" to "L", and the PMOS transistor 6 is turned on. When the PMOS transistor 6 is turned on, an input voltage signal Vi is allowed to be inputted. The voltage Vn at the node NA is converged to the threshold voltage Vt of the inverter 4. The above operation is repeated in response to the clock signal CK.

According to the chopper type comparator, shown in FIG. 2, a delayed clock signal is supplied to the input switch circuit 2 and the PMOS transistor 6, while a regular clock signal CK is supplied to the PMOS transistor 7 and 8. As a result, harmful effect of voltage variation at the node NA, which is cause by a parasitic capacitance Cp generated between the source and substrate of the PMOS transistor 6 when the PMOS transistor PMOS transistor 8 is turned on, can be prevented. Therefore, an offset difference can be reduced.

Figure 4:
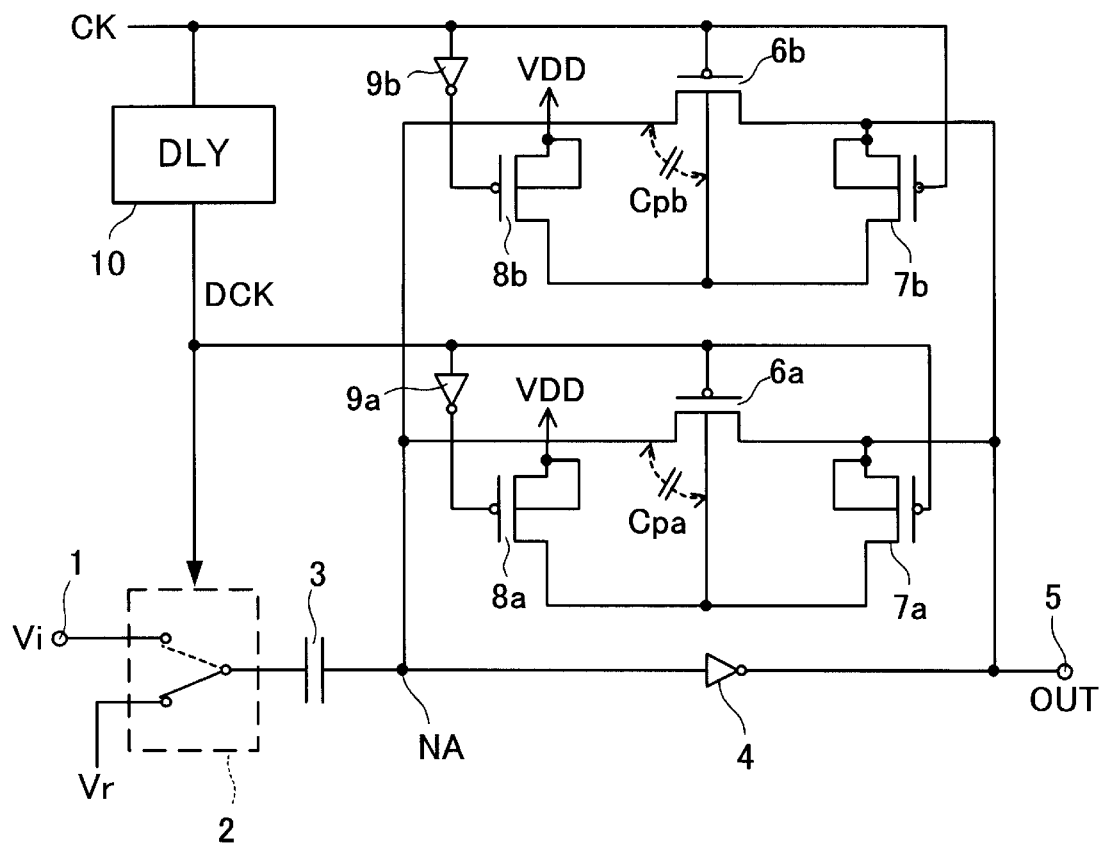
FIG. 4 is a circuit diagram showing a chopper type comparator according to the present invention.

FIG. 4 shows another chopper type comparator according to the present invention. In FIG. 4, the same and corresponding elements to those in FIGS. 1 and 2 are represented by the same reference symbols and the same description is not repeated.

The comparator includes an input terminal 1, an input switch circuit 2, a capacitor 3, an inverter 4, an output terminal 5 and a delay circuit 10. The comparator further includes a first switch circuit (6a, 7a, 8a and 9a) and a second switch circuit (6b, 7b, 8b and 9b), each of which operates to turn on and off the inverter 4.

The input switch circuit 2 inputs an input voltage Vi and a reference voltage Vr alternately in response to a delayed clock signal DCK. The output terminal 5 supplies an output voltage, having a level defined based on the difference between the input voltage Vi and the reference voltage Vr. The capacitor 3 is coupled between the input switch circuit and the output terminal. A node NA is coupled between the capacitor 3 and the output terminal 5. The inverter 4 is coupled between the node NA and the output terminal 5.

The first switch circuit include a first PMOS transistor 6a and a first bias control circuit, which includes PMOS transistors 7a and 8a and an inverter 9a. The first PMOS transistor 6a is coupled between the node NA and the output terminal 5 in parallel to the inverter 4. The first bias control circuit (7a, 8a and 9a) selectively connects the substrate voltage terminal of the first PMOS transistor 6a to the supply terminal VDD and the output terminal 5 in response to the delay clock signal DCK.

The second switch circuit include a second PMOS transistor 6b and a second bias control circuit, which includes PMOS transistors 7b and 8b and an inverter 9b. The second PMOS transistor 6b is coupled between the node NA and the output terminal 5 in parallel to the inverter 4. Each of gate widths of the PMOS transistors 6a and 6b are determined to be a half of a gate width of the PMOS transistor 6, shown in FIG. 2. The second bias control circuit (7b, 8b and 9b) selectively connects the substrate voltage terminal of the second PMOS transistor 6b to the supply terminal VDD and the output terminal 5 in response to the delay clock signal DCK.

In operation, first, the PMOS transistors 6a, 6b, 7a and 7b are turned on, and the PMOS transistors 8a and 8b are turned off, so that the node NA has a voltage potential corresponding to a threshold volt age Vt of the inverter 4.

Next, the PMOS transistors 6b and 7b are turned off, and the PMOS transistor 8b is turned on. A voltage at the node NA is changed in a small range due to a parasitic capacitance Cpb, generated between a source and a substrate of the PMOS transistor 6b and charge partitioning, generated between the node and the capacitance 3. After such a small change, a voltage at the node NA reestablishes to the threshold voltage Vt, since the PMOS transistor 6a is in an on state.

Subsequently, the PMOS transistors 6a and 7a are turned off, and the PMOS transistor 8a is turned on. A voltage at the node NA is changed in a small range due to a parasitic capacitance Cpb, generated between a source and a substrate of the PMOS transistor 6a and charge partitioning, generated between the node and the capacitance 3. Such a voltage change at the node NA is small, because the PMOS transistor 6a has a gate width that is a half of the PMOS transistor 6, shown in FIG. 2, and a parasitic capacitance should also be a half of the comparator shown in FIG. 2.

As described above, according to the chopper type comparator shown in FIG. 4, a couple of PMOS transistors 6a and 6b are used in place of a single PMOS transistor 6, shown in FIGS. 1 and 2, and each of the PMOS transistors 6a and 6b has a gate width that is a half of a gate width of the PMOS transistor 6. In addition, the PMOS transistors 6a and 6b operate at different timing. As a result, each of parasitic capacitances Cpa and Cpb is a half of Cp, shown in FIGS. 1 and 2, so that voltage change at the node NA is suppressed.

The present invention is not limited by the embodiments, shown in FIGS. 1, 2 and 4. For example, the input switch circuit 2 can be designed to connect the input terminal 1 and the capacitor 3 when the PMOS transistor 6 is in an off state. It can replace with the PMOS transistors 6–8, 6a–8a and 6b–8b and NMOS transistors are employed. The PMOS transistors 6a and 6b can have different gate widths. Preferably, the gate width of the PMOS transistor 6a is determined to be smaller than that of the PMOS transistor 6b in order that a voltage variation at the node NA can be more decreased.

What is claimed is:

1. A chopper type comparator, comprising:
   an input switch circuit which inputs an input voltage and a reference voltage alternately in response to a control signal;

an output terminal which supplies an output voltage, having a level defined based on the difference between the input voltage and the reference voltage;

a capacitor which is coupled between the input switch circuit and the output terminal;

a node which is coupled between the capacitor and the output terminal;

a first inverter coupled between the node and the output terminal;

a first MOS transistor which is coupled between the node and the output terminal in parallel to the first inverter and operates in response to the control signal, the first MOS transistor having a substrate voltage terminal;

a supply terminal which provides a supply voltage;

a bias control circuit which selectively connects the substrate voltage terminal of the first MOS transistor to the supply terminal and the output terminal in response to the control signal; and a timing control circuit which provide a delay to the control signal to be supplied to the first MOS transistor and the input switch circuit.

2. A chopper type comparator according to claim 1, wherein the bias control circuit comprises:

i) a second MOS transistor which is connected between a drain of the first MOS transistor and the substrate voltage terminal of the first MOS transistor; and ii) a third MOS transistor which is connected between the supply terminal and the substrate voltage terminal of the first MOS transistor.

3. A chopper type comparator according to claim 2, further comprising:

a second inverter having an input terminal supplied with the control signal and an output terminal connected to a gate of the third MOS transistor.

4. A chopper type comparator according to claim 1, wherein the control signal is a clock signal.

5. A chopper type comparator according to claim 1, wherein the timing control circuit is a delay circuit, an output terminal of which is connected to a gate of the first MOS transistor and the input switch circuit.

6. A chopper type comparator, comprising:

an input switch circuit which inputs an input voltage and a reference voltage alternately in response to a control signal;

an output terminal which supplies an output voltage, having a level defined based on the difference between the input voltage and the reference voltage;

a capacitor which is coupled between the input switch circuit and the output terminal;

a node which is coupled between the capacitor and the output terminal;

a first inverter coupled between the node and the output terminal;

a first MOS transistor which is coupled between the node and the output terminal in parallel to the first inverter and operates in response to the control signal, the first MOS transistor having a substrate voltage terminal;

a second MOS transistor which is coupled between the node and the output terminal in parallel to the first inverter and operates in response to the control signal, the second MOS transistor having a substrate voltage terminal;

a supply terminal which provides a supply voltage;

a first bias control circuit which selectively connects the substrate voltage terminal of the first MOS transistor to the supply terminal and the output terminal in response to the control signal;

a second bias control circuit which selectively connects the substrate voltage terminal of the second MOS transistor to the supply terminal and the output terminal in response to the control signal;

a timing control circuit which provide a delay to the control signal to be supplied to the first MOS transistor, the first bias control circuit and the input switch circuit.

7. A chopper type comparator according to claim 6, wherein the first bias control circuit comprises:

i) a third MOS transistor which is connected between a drain of the first MOS transistor and the substrate voltage terminal of the first MOS transistor; and ii) a fourth MOS transistor which is connected between the supply terminal and the substrate voltage terminal of the first MOS transistor, and the second bias control circuit comprises:

i) a fourth MOS transistor which is connected between a drain of the second MOS transistor and the substrate voltage terminal of the second MOS transistor; and ii) a fifth MOS transistor which is connected between the supply terminal and the substrate voltage terminal of the second MOS transistor.

8. A chopper type comparator according to claim 7, wherein the first bias control circuit further comprises a second inverter having an input terminal connected to the timing control circuit and an output terminal connected to a gate of the third MOS transistor, and the second bias control circuit further comprises a third inverter having an input terminal supplied with the control signal and an output terminal connected to a gate of the fifth MOS transistor.

9. A chopper type comparator according to claim 6, wherein the control signal is a clock signal.

10. A chopper type comparator according to claim 6, wherein the timing control circuit is a delay circuit, an output terminal of which is connected to a gate of the first MOS transistor and the input switch circuit.

\* \* \* \* \*